United States Patent
Curello et al.

(10) Patent No.: US 8,174,060 B2
(45) Date of Patent: *May 8, 2012

(54) SELECTIVE SPACER FORMATION ON TRANSISTORS OF DIFFERENT CLASSES ON THE SAME DEVICE

(75) Inventors: Giuseppe Curello, Portland, OR (US); Ian R. Post, Portland, OR (US); Chia-Hong Jan, Beaverton, OR (US); Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/040,951

(22) Filed: Mar. 4, 2011

(65) Prior Publication Data

US 2011/0157854 A1   Jun. 30, 2011

Related U.S. Application Data

(62) Division of application No. 12/419,242, filed on Apr. 6, 2009, which is a division of application No. 11/479,762, filed on Jun. 30, 2006, now Pat. No. 7,541,239.

(51) Int. Cl.
*H01L 31/119* (2006.01)
*H01L 21/8238* (2006.01)
(52) U.S. Cl. ........................ 257/311; 438/230
(58) Field of Classification Search .................. 438/184, 438/230, 287, 303; 257/296, 311, E27.016–E27.021
See application file for complete search history.

(56) References Cited

U.S. PATENT DOCUMENTS

| 5,508,539 A | 4/1996 | Gilbert et al. |
| 5,942,450 A | 8/1999 | Song |
| 5,965,464 A * | 10/1999 | Tsai et al. ............... 438/723 |
| 6,121,099 A | 9/2000 | Fulford, Jr. et al. |
| 6,121,100 A | 9/2000 | Andideh et al. |
| 6,198,142 B1 | 3/2001 | Chau et al. |
| 6,255,152 B1 | 7/2001 | Chen |
| 6,326,664 B1 | 12/2001 | Chau et al. |

(Continued)

FOREIGN PATENT DOCUMENTS

JP   03257962   11/1991

(Continued)

OTHER PUBLICATIONS

Ghani, T., "A 90nm High Volume Manufacturing Logic Technology Featuring Novel 45nm Gate Length Strained Silicon CMOS Transistors", 2003 IEEE, IEDM. Technical Digest, pp. 978-980, 3 pages.

(Continued)

*Primary Examiner* — Calvin Lee
(74) *Attorney, Agent, or Firm* — Blakely, Sokoloff, Taylor & Zafman LLP

(57) ABSTRACT

A method of selectively forming a spacer on a first class of transistors and devices formed by such methods. The method can include depositing a conformal first deposition layer on a substrate with different classes of transistors situated thereon, depositing a blocking layer to at least one class of transistors, dry etching the first deposition layer, removing the blocking layer, depositing a conformal second deposition layer on the substrate, dry etching the second deposition layer and wet etching the remaining first deposition layer. Devices may include transistors of a first class with larger spacers compared to spacers of transistors of a second class.

1 Claim, 7 Drawing Sheets

U.S. PATENT DOCUMENTS

| | | |
|---|---|---|
| 6,335,565 B1 | 1/2002 | Miyamoto et al. |
| 6,342,421 B1 | 1/2002 | Mitani et al. |
| 6,368,926 B1 | 4/2002 | Wu et al. |
| 6,368,927 B1 | 4/2002 | Lee |
| 6,372,583 B1 | 4/2002 | Tyagi |
| 6,391,692 B1 | 5/2002 | Nakamura |
| 6,417,550 B1 | 7/2002 | Madurawe et al. |
| 6,506,642 B1 | 1/2003 | Luning et al. |
| 6,541,343 B1 | 4/2003 | Murthy et al. |
| 6,599,803 B2 | 7/2003 | Weon et al. |
| 6,621,131 B2 | 9/2003 | Murthy et al. |
| 6,787,852 B1 | 9/2004 | Yu et al. |
| 6,797,556 B2 | 9/2004 | Murthy et al. |
| 6,806,584 B2 | 10/2004 | Fung et al. |
| 6,887,762 B1 | 5/2005 | Murthy et al. |
| 6,943,077 B2 | 9/2005 | Liu et al. |
| 6,946,709 B2 * | 9/2005 | Yang .............................. 257/371 |
| 7,019,326 B2 | 3/2006 | Cea et al. |
| 7,045,408 B2 | 5/2006 | Hoffmann et al. |
| 7,101,765 B2 | 9/2006 | Curello et al. |
| 7,112,859 B2 | 9/2006 | Ban et al. |
| 7,541,239 B2 | 6/2009 | Curello et al. |
| 2001/0031536 A1 | 10/2001 | Shenoy |
| 2004/0001943 A1 | 1/2004 | Alford et al. |
| 2004/0007724 A1 | 1/2004 | Murthy et al. |
| 2004/0072395 A1 | 4/2004 | Liu |
| 2004/0075151 A1 | 4/2004 | Fung et al. |
| 2004/0087090 A1 * | 5/2004 | Grudowski et al. |
| 2004/0140507 A1 | 7/2004 | Park et al. |
| 2004/0166611 A1 | 8/2004 | Liu |
| 2004/0188760 A1 | 9/2004 | Skotnicki et al. |
| 2004/0229463 A1 | 11/2004 | Yamada et al. |
| 2004/0262683 A1 | 12/2004 | Bohr et al. |
| 2004/0262784 A1 * | 12/2004 | Doris et al. |
| 2006/0065937 A1 | 3/2006 | Hoffmann et al. |
| 2006/0113616 A1 * | 6/2006 | Liu et al. |
| 2006/0145273 A1 | 7/2006 | Curello et al. |
| 2009/0189193 A1 * | 7/2009 | Curello et al. ................. 257/202 |

FOREIGN PATENT DOCUMENTS

| | | |
|---|---|---|
| JP | 2001093984 | 4/2001 |
| KR | 1019990049416 | 11/1999 |
| WO | WO-2004034458 | 4/2004 |
| WO | WO2004095565 | 11/2004 |
| WO | WO-2006074438 | 7/2006 |

OTHER PUBLICATIONS

Intel Corporation, PCT International Search Report (dated May 12, 2006), International Application No. PCT/US2006/000686, International Filing Date—Jan. 5, 2006, 12 pages.

Intel Corporation, PCT International Search Report and Written Opinion (dated Mar. 29, 2006), International Application No. PCT/US2005/035474, International Filing Date—Sep. 29, 2005, 11 pages.

Intel Corporation, Non-Final Office Action (dated Dec. 5, 2006), U.S. Appl. No. 10/954,914, filed Sep. 30, 2004, First Named Inventor: Thomas Hoffmann, 6 pages.

Intel Corporation, Non-Final Office Action (dated Sep. 12, 2007), U.S. Appl. No. 10/954,914, filed Sep. 30, 2004, First Named Inventor: Thomas Hoffmann, 7 pages.

Intel Corporation, Final Office Action (dated Mar. 17, 2008), U.S. Appl. No. 10/954,914, filed Sep. 30, 2004, First Named Inventor: Thomas Hoffmann, 8 pages.

Intel Corporation, Non-Final Office Action (dated Nov. 4, 2008), U.S. Appl. No. 11/479,762, filed Jun. 30, 2006, First Named Inventor: Giuseppe Curello, 10 pages.

Intel Corporation, Office Action dated Jul. 7, 2008 for German Application No. 11 2006 000 148.5-33.

Intel Corporation, Chinese Office Action dated Nov. 13, 2009 for Chinese Patent Application No. 200780019879.2.

Intel Corporation, Chinese Office Action dated May 11, 2010 for Chinese Patent Application No. 200780019879.2.

Intel Corporation, German Office Action dated Feb. 22, 2010 for German Patent Application No. 112007001161.0-33.

Intel Corporation, Non-final Office Action mailed Sep. 2, 2010 for U.S. Appl. No. 12/419,242, 8 pages.

Intel Corporation, Korean Notice of Preliminary Rejection dated Oct. 28, 2010 for KR 2008-7031908.

Intel Corporation, Taiwanese Office Action dated Oct. 7, 2010 for TW Appln. No. 096123560.

Intel Corporation, Chinese Office Action dated Oct. 20, 2010 for CN Appln. No. 200780019879.2.

Intel Corporation, PCT Search Report mailed Dec. 28, 2007, PCT Appln No. PCT/US2007/015224, 10 pages.

Intel Corporation, Chinese Office Action dated Mar. 30, 2011 for CN Appln. No. 200780019879.2.

Intel Corporation, Taiwan IPO Search Report dated Feb. 21, 2011 for TW Application No. 096123560.

* cited by examiner

SELECTIVE SPACER FORMATION ON TRANSISTORS OF DIFFERENT CLASSES ON THE SAME DEVICE

CROSS-REFERENCE TO RELATED APPLICATION

The application is a divisional of co-pending U.S. patent application Ser. No. 12/419,242, filed Apr. 6, 2009, which application is a divisional of U.S. patent application Ser. No. 11/479,762, filed Jun. 30, 2006, now U.S. Pat. No. 7,541,239.

FIELD OF INVENTION

Semiconductor manufacturing.

BACKGROUND OF INVENTION

Metal-oxide-semiconductor (MOS) transistors are the primary building blocks for modem integrated circuits. A typical highly integrated circuit, such as a microelectronic device, can contain millions of transistors on a single silicon substrate no bigger than a thumbnail. Generally, a transistor, or device and hereinafter referred to interchangeably, includes a gate structure formed on a substrate with a source region and a drain region, separated from each other by the gate structure and formed within the substrate, adjacent to the gate structure. A transistor may be thought of as an electronic switch having three nodes. When a voltage is applied to a first node of the transistor, i.e., the gate, the flow of electric current between the other two nodes, i.e., the source and the drain regions, via a channel region below the gate, is modulated. For example, to turn one type of n-channel (NMOS) transistor "ON," a positive voltage is applied to the gate, allowing electric current to flow between the source and drain. To turn this transistor "OFF," zero volts is applied to the gate which cuts off the flow of electric current between the source and drain.

The type of transistor on a microelectronic device varies depending on its intended function. Examples of transistors include NMOS and PMOS transistors used in Logic circuits and NMOS and PMOS transistors used in SRAM circuits. Generally, the function of Memory transistors require less power (and therefore slower current flow) while Logic transistors require more power (and therefore faster current flow). Power (represented by the formula Power equals I×V, wherein I equals current and V equals voltage) is measured by the speed of electrons moving from the source and drain regions via the channel region. One method of controlling this movement, and hence the power of a given transistor, is to control the distance from the source region to the drain region. Typically, because Memory transistors require less power, the distance from the source region to the drain region is larger when compared to that of a Logic transistor.

Distance between the source region and the drain region also affects leakage of current flow in the OFF state. "Leakage" is the amount of current flowing through the transistor when in the OFF state. Although a given transistor is in the OFF state, a small amount of current continues to flow through the channel region. The total current of a transistor is measured by the current flow in both the ON and OFF states. That is, current (I) equals $I_{ON}+I_{OFF}$, where $I_{OFF}$ is very small compared to $I_{ON}$. The greater the distance between the source region and the drain region, the smaller the leakage. However, the trade-off is that the overall speed of the transistor is lessened.

DETAILED DESCRIPTION

Figure 1A:
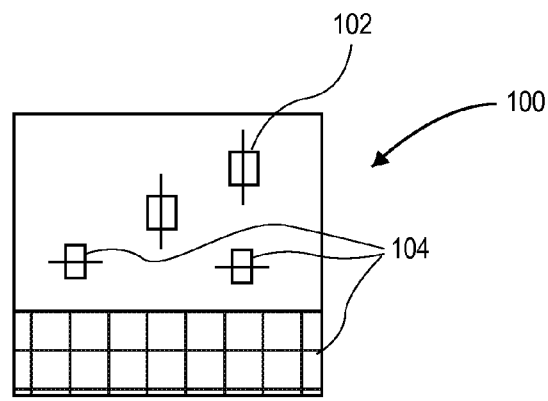
FIG. 1A illustrates an embodiment of a microelectronic device.

Fabrication of transistors can involve the formation of "spacer" structures adjacent to gate structures. Spacers insulate gate stacks and provide distance between a source region and a drain region to, for example, decrease OFF state leakage, which consequentially reduces power. In some fabrication methods, a conformal layer is deposited on the substrate with a multitude of gate structures thereon. The conformal layer is then anisotropically etched leaving spacer structures adjacent to the gate structure. "Anisotropic etching" is an etch process that exhibits little or no undercutting, resulting in features whose sides are perpendicular to the underlying layer.

In some microelectronic device fabrication methods, efficiency of a device is increased by doping the source and drain regions with, for example, silicon-germanium SiGe or silicon-carbon SiC. SiGe can be introduced such that it can cause compressive strain on a channel region, which in turn increases the speed of holes traveling from the source region to the drain region of a PMOS device. SiC can be introduced such that it can cause tensile strain on a channel region, which in turn increases the speed of electrons traveling from the source region to the drain region of an NMOS device In some applications, however, conventional spacer structure fabrication methods do not allow for sufficient space between gate structures for doping of the source and drain regions alternating between gate to gate.

Current complementary metal-oxide-semiconductor (CMOS) fabrication processes for microelectronic devices incorporate both PMOS and NMOS multileg (isolated and somewhat randomly oriented) layout transistor devices and SRAM array devices on the same substrate. Due to the large number of SRAM devices in an array layout, the gate-to-gate space between SRAM devices is generally smaller compared to the gate-to-gate space between Logic transistors, which are fewer in number and randomly situated. In some applications, a first class of transistors situated on the same substrate as a second class of transistors can have a decrease in OFF state leakage at the expense of decreased power. In some embodiments, a first class of transistors can be include transistors with a first predetermined sized spacer and a second class of transistors can include transistors with a second different predetermined sized spacer. Such an embodiment can be useful in, for example, a laptop computer battery in which speed of the computer may be compromised in return for a longer battery lifetime. In some embodiments, a method to accomplish this is to increase the size of the spacer. However, fabrication methods can involve depositing a conformal layer on a die with different classes of transistors situated thereon, which deposition does not discriminate between the different classes of transistors. As a result, the spacers formed thereafter are substantially the same thickness with respect to the different classes of transistors. Thus, while accomplishing reduction of OFF state leakage in one class of transistors, e.g., PMOS Logic transistors, this can result in largely degraded performance on certain transistors in which there is a small gate-to-gate space, such as in a SRAM transistor array or stacked devices, leading to degraded performance and, eventually, function failure.

In some applications, a microelectronic device, representatively shown in FIG. 1A, can include both Logic transistors 102 and other types of transistors 104 on the same die 100. Other types of transistors can include, but are not limited to, SRAM Memory, hereinafter collectively referred to as "non-Logic transistors." Logic transistors generally require more power relative to non-Logic transistors. Thus, the distance between the source and drain regions can be smaller in Logic transistors when compared to non-Logic transistors. As a consequence, the $I_{OFF}$ can be higher in Logic transistors when compared to non-Logic transistors. In some applications, such as those applications requiring a slower efficiency yet a longer life, the Logic transistors can be configured to have a low $I_{OFF}$.

Figure 1B:
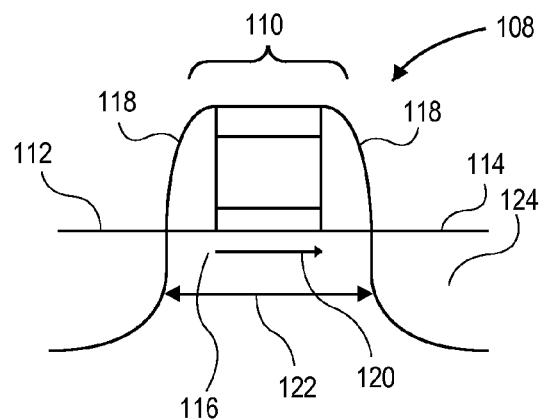
FIG. 1B shows a cross-sectional side view of a MOS transistor.

FIG. 1B represents an embodiment of MOS transistor 108. MOS transistor includes a gate structure 110, source region 112 and drain region 114 formed on substrate 124. The gate structure 110 can include spacers 118 located adjacent thereto. In the ON state, i.e., when negative voltage is applied, holes flow from source region 112 to drain region 114 via channel region 116, representatively shown by arrow 120. In the OFF state, i.e., when no voltage is applied, a small of amount of current, or leakage, continues to flow from source region 112 to drain region 114 via channel region 116. Leakage is a direct function of the distance between source region 112 and drain region 114, representatively shown by arrow 122. That is, the smaller gate structure 110 provides a smaller distance between source and drain regions 110 and 112, respectively. Such configuration generally allows for relatively increased speed at the cost of high leakage.

Figure 1C:
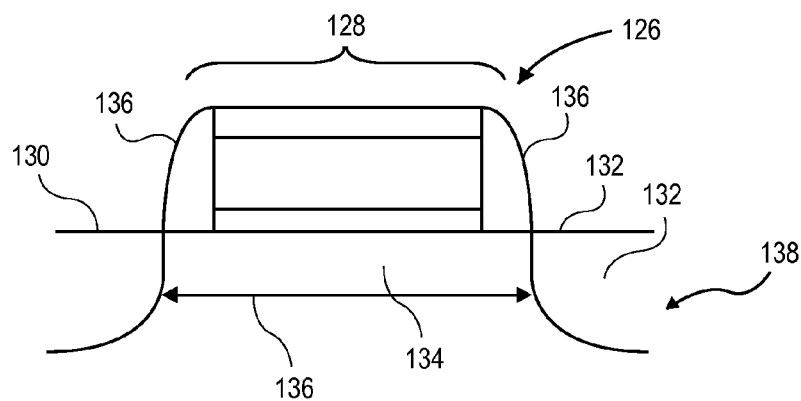
FIG. 1C shows a cross-sectional side view of a SRAM transistor.

FIG. 1C represents an embodiment of an SRAM transistor 130. SRAM transistor includes gate structure 126 a gate structure 128, source region 130 and drain region 132 formed on substrate 138. Similar to the embodiment in FIG. 1B, a channel region 134 and spacers 136 are also provided. The distance between source 130 and drain 132 is representatively shown by arrow 136. The larger gate structure 128 provides a greater distance between source region 130 and drain region 132. Such configuration generally allows for relatively slower speed with low leakage.

On a die, MOS Logic transistors can be situated at random, while non-Logic transistors can be situated in an array. In some embodiments, an array takes up a larger space relative to the randomly situated Logic transistors on a given die. Thus, the gate-to-gate space, i.e., the pitch, should be as small as possible for array of non-Logic transistors, such as an SRAM array. For Logic transistors, the pitch can be approximately 180 nanometers (nm). For SRAM transistors, the pitch can be approximately 160 nm.

Figure 2A:
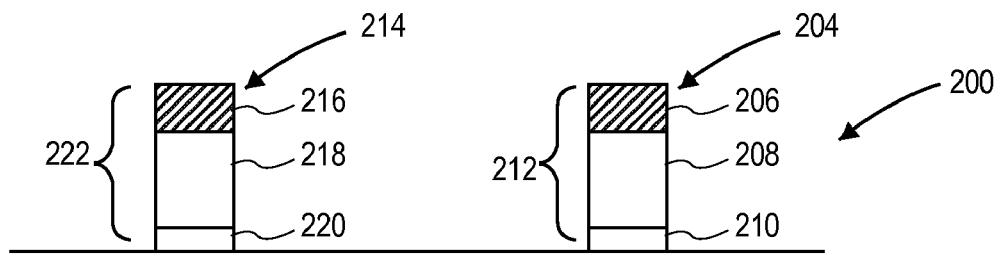
FIG. 2A shows a cross-sectional side view of a portion of microelectronic device including an embodiment of a first class of transistor and an embodiment of a second class of transistor thereon.

FIGS. 2A-2H illustrate an embodiment of a method for selectively forming a spacer on a gate structure of a first class of transistor. FIG. 2A shows a portion of a microelectronic device 100, representatively shown as die 200, including a substrate 202 with an embodiment of a transistor 204 of a first class and an embodiment of a transistor 214 of a second class situated thereon. Transistor 204 can include an etch stop 206, a gate electrode 208 and a dielectric 210, collectively, a gate structure 212. Etch stop portion 206 can be, for example, silicon nitride ($Si_3N_4$), oxynitride ($SiO_yN_x$) and the like; gate electrode 208 can be, for example, a polycrystalline semiconductor, such as polycrystalline silicon (polysilicon), polysilicon germanium (poly-SiGe) or a metal having, for example, a work function appropriate for a p-type or n-type semiconductor; and dielectric 210 can be a non-conductive material, such as silicon dioxide, silicon nitride and the like. Transistor 214 can include an etch stop 216, a gate electrode 218 and a dielectric 220, collectively, a gate structure 232. The materials of gate structure 222 can be similar to those of gate structure 212. In some embodiments, transistor 204 can be an NMOS or PMOS within an SRAM or NMOS Logic transistor and transistor 214 can be a PMOS Logic transistor.

Figure 2B:
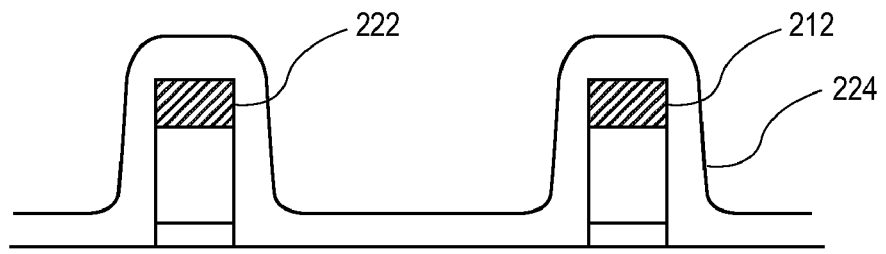
FIG. 2B shows FIG. 2A following the formation of a first deposition layer thereon.

FIG. 2B shows an embodiment of the formation of first deposition layer 224 on microelectronic device 100 of FIG. 2A. In some embodiments, first deposition layer 224 can be a dielectric material. In some embodiments, first deposition layer 224 can be conformal. First deposition layer 224 can be in a range of approximately 50 Angstroms (Å) to 1500 Å. In some embodiments, first deposition layer 224 can be in a range from approximately 200 Å to 600 Å. The first deposition layer 224 can be applied by processes known in the art. Examples of such processes include, but are not limited to, physical vapor deposition (PVD), atomic layer deposition (ALD), chemical vapor deposition (CVD), low pressure CVD, plasma-enhanced CVD or any other suitable process.

Figure 2C:
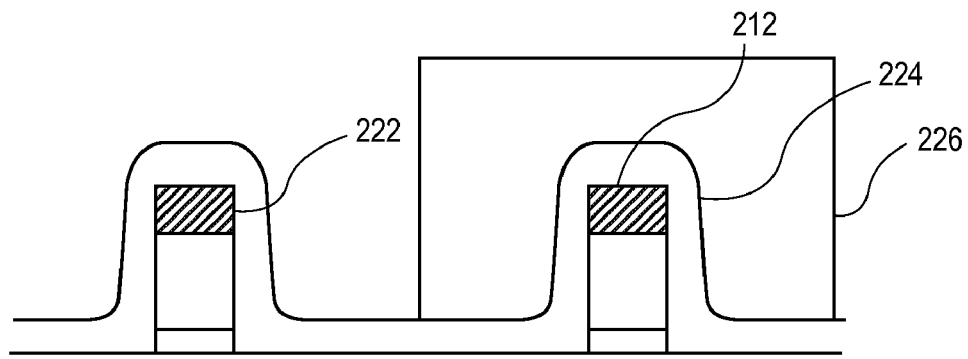
FIG. 2C shows FIG. 2B following the formation of a blocking layer thereon.

FIG. 2C shows an embodiment of the selective formation of a blocking layer 226 on microelectronic device 100 of FIG. 2B. In some embodiments, blocking layer 226 can be a photoimaging material, such as a photoresist. Photoresists can be applied by a process known as photolithography, also known as photomasking. "Photolithography" is a process used to selectively create patterns on a substrate surface. "Patterning" is the basic operation that removes specific portions of the uppermost layer at a given fabrication step on the substrate surface. Photoresists can be either negative or positive. In both forms, photoresists are three-component materials including a matrix, a photoactive compound and a solvent. For positive photoresists, the matrix may be a low-molecular weight novolac resin, the photoactive component may be a diazonaphthaquinone compound and the solvent system may be a mixture of n-butyl acetate, xylene and cellosolve acetate. For negative photoresists, the matrix may be cyclized synthetic rubber resin, the photoactive component may be a bis-arylazide compound and the solvent system may be an aromatic solvent. In some embodiments, blocking layer 226 can be selectively deposited on, or applied to, transistor 204 of the first class. In some embodiments, blocking layer 226 can be applied to an array of transistors.

Figure 2D:
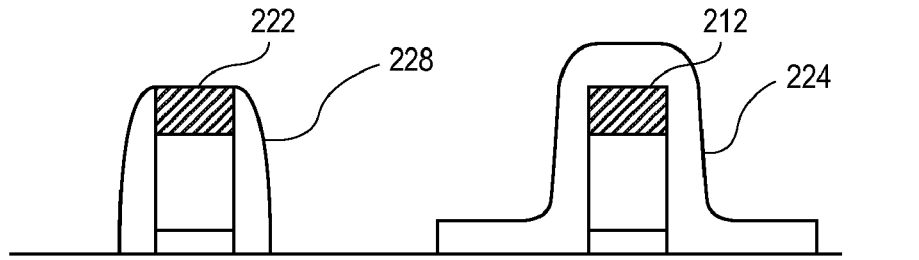
FIG. 2D shows FIG. 2C following selective etching.

FIG. 2D shows an embodiment of FIG. 2C following selective removal of first deposition layer 224. In some embodiments, first deposition layer 224 can be dry etched from gate structure 222 while blocking layer 226 remains on gate structure 212. Dry etching can be performed by such processes including, but not limited to, reactive ion etching, sputter etching and vapor phase etching. Dry etching can result in isotropic etching. "Isotropic etching" is a process in which etching occurs in all directions causing undercutting. After the dry etching is performed on the exposed portion of first deposition layer 224, blocking layer 226 can be removed from gate structure 212 by a process known as "ashing." "Ashing" is a method of stripping photoresist that utilizes high energy gas, usually an oxygen plasma or ozone, to burn off photoresist. The result is gate structure 222 with a first spacer layer 228 adjacent thereto and gate structure 212 covered with first deposition layer 224 substantially or completely intact.

Figure 2E:
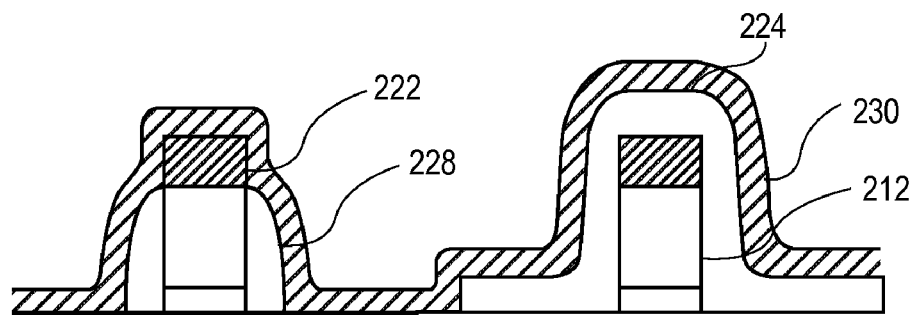
FIG. 2E shows FIG. 2D following the formation of a second deposition layer thereon.

FIG. 2E shows an embodiment of FIG. 2D following the formation of a second deposition layer thereon. In some embodiments, second deposition layer 230 can be a dielectric material, which, in some applications, can be a different material than that of first deposition layer 227. Examples of dielectric materials comprising second deposition layer include, but are not limited to, nitrides such as ($Si_3N_4$), ($SiO_yN_x$) and the like. In some embodiments, the second deposition layer 230 can be conformal. Second deposition layer 230 can be in a range of approximately 100 Å to 1000 Å. In some embodiments, second deposition layer 230 can be in a range from approximately 200 Å to 600 Å. Second deposition layer 230 can be applied by processes known in the art, including, but not limited to, PVD, ALD, CVD, low pressure CVD, plasma-enhanced CVD or any other suitable process.

Figure 2F:
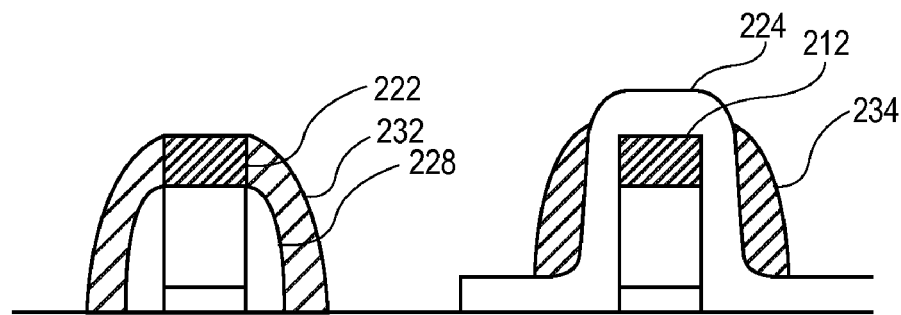
FIG. 2F shows FIG. 2E following a selective etching process.

FIG. 2F shows an embodiment of FIG. 2E following removal of second deposition layer 230. In some embodiments, second deposition layer 230 can be dry etched from gate structures 212 and 222 of both transistors 204 and 214. Dry etching can be performed by such processes which include, but are not limited to, reactive ion etching, sputter etching and vapor phase etching. Dry etching can result in isotropic etching. After the etching, a bi-layer spacer 236 including first spacer layer 228 and second spacer layer 232 remains adjacent to gate structure 222 of transistor 214. Gate structure 212 of transistor 204, on the other hand, includes remaining first deposition layer 224 with removable spacer layer 234 adjacent thereto.

Figure 2G:
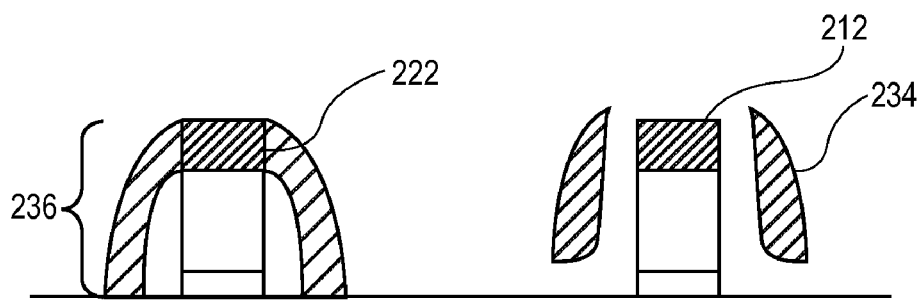
FIG. 2G shows FIG. 2F during a selective etching process.

FIG. 2G shows an embodiment of FIG. 2F during a selective etching process of remaining first deposition layer 224 from gate structure 212. In some embodiments, remaining first deposition layer 224 can be wet etched from gate structure 212. Wet etching can be performed by dipping, spraying or otherwise applying a chemical solution to the substrate. Wet etching can result in isotropic etching which will etch at the same rate in both vertical and horizontal direction. In some embodiments, after the wet etching process, remaining second deposition layer 230 will be removed from gate structure 212 automatically. That is, because the remaining first deposition layer 224 has been removed by the wet etching process, removable spacer 234 has nothing with which to adhere (both at the bottom and at the side) and will automatically be effaced.

Figure 2H:
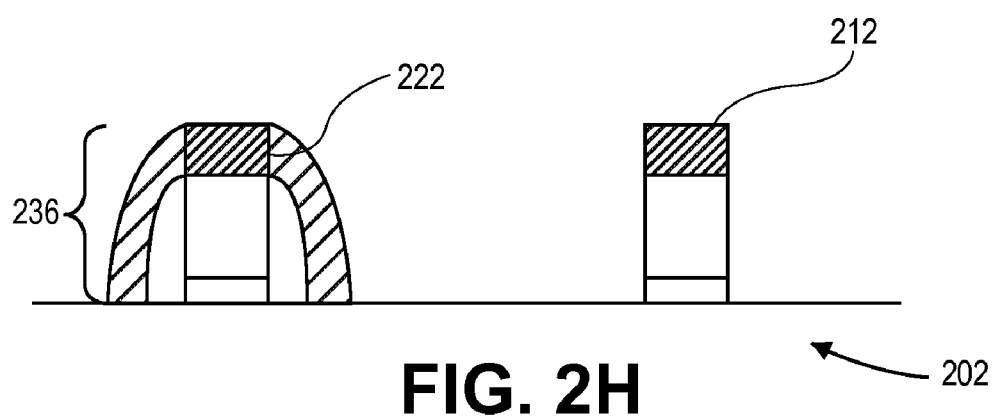
FIG. 2H shows FIG. 2G following a selective etching process.

FIG. 2H shows an embodiment of FIG. 2G following the selective etching process described with respect to FIG. 2G. Gate structure 222 of transistor 214 will include bi-layer spacer 236 adjacent thereto and gate structure 212 of transistor 204 will not include any spacer as a result of embodiments of the method described with respect to FIGS. 2A-2G. In some embodiments, the bi-layer spacer 236 can be in the range of approximately 5 nm to 10 nm. It should be appreciated that the method embodied in FIGS. 2A-2H may be repeated on the same die to form more spacers.

Figure 2I:
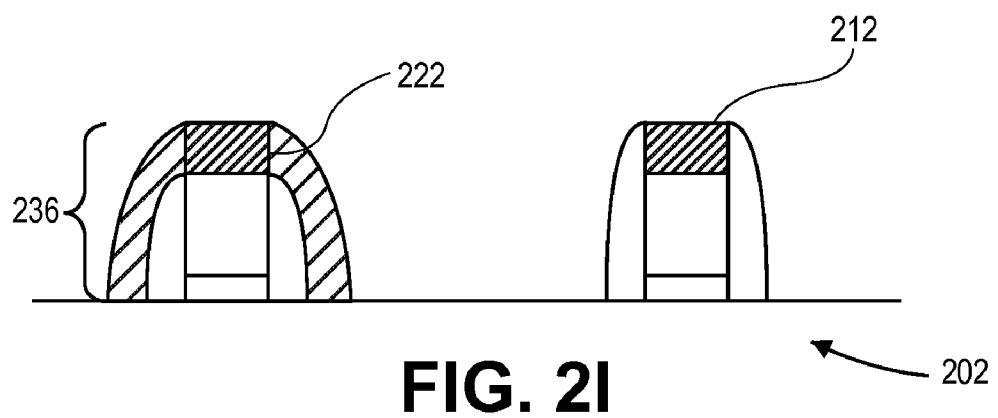
FIG. 2I shows FIG. 2G following an etching process.

In some embodiments, subsequent to the method embodied in FIGS. 2A-2H, a conventional spacer deposition process may be performed on the substrate. Such process may include depositing a conformal first deposition layer, dry etching the first deposition layer, depositing a conformal second deposition layer and dry etching the second deposition layer, resulting in spacer formed adjacent to a multitude of transistors. Thus, in some embodiments, a die which was subjected to a selective spacer deposition process may be subjected to subsequent selective spacer deposition processes or conventional spacer deposition processes to form spacers of varying sizes on transistors of varying classes (see FIG. 2I). For example, in some embodiments, a combination of at least one selective spacer deposition process and at least one conventional spacer deposition process may result in a first class of transistors having a spacer of from approximately 10 nm to 50 nm and a second class of transistors having a spacer of from approximately 50 nm to 100 nm. In some embodiments, the first class of transistors may be Logic transistors and the second class of transistors may be non-Logic transistors.

Figure 3:
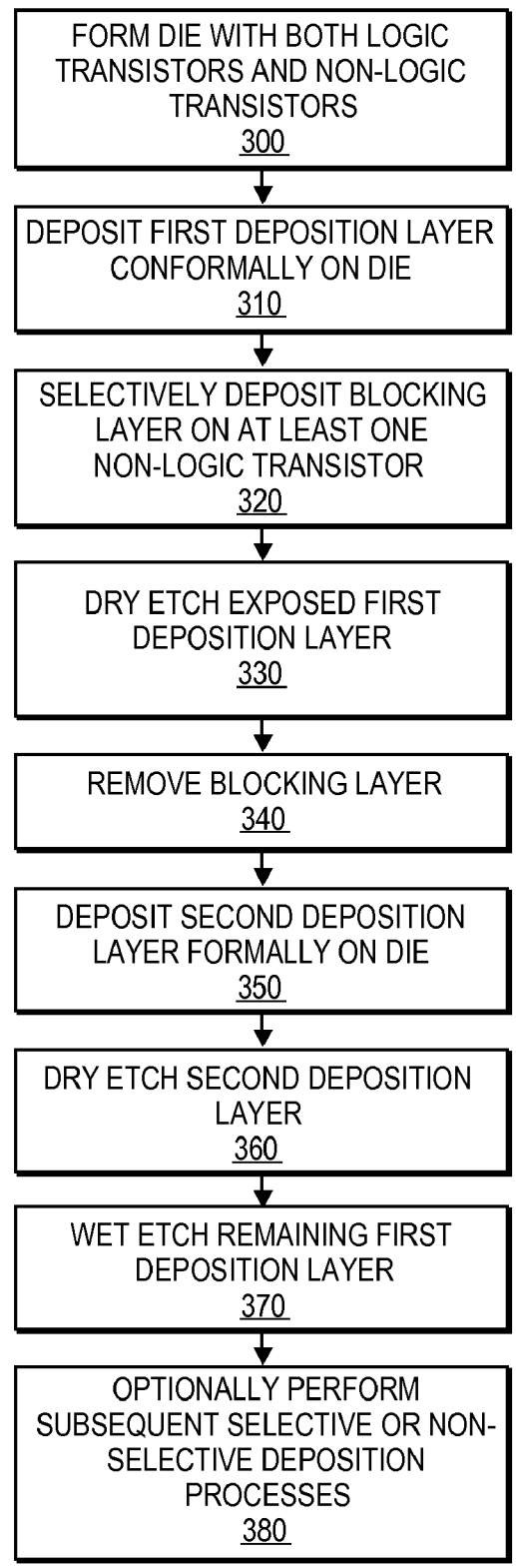
FIG. 3 illustrates a schematic of an embodiment of one method of selectively depositing a spacer on a microelectronic device.

FIG. 3 represents a schematic of an embodiment of a selective spacer deposition process. A die can be formed with both Logic transistors and non-Logic transistors (300). In some embodiments, Logic transistors are situated randomly and Memory transistors are arranged in an array. A first deposition layer can be conformally deposited on the die (310). Then, a blocking layer can be selectively deposited on at least one non-PMOS transistor (320). A dry etch process can be performed on the first deposition layer (330). Subsequently, the blocking layer can be removed by ashing or any other suitable method (340). Thereafter, a second deposition layer can be conformally deposited on the die (350). A dry etch process can be performed on the second deposition layer (360). Any remaining first deposition layer may then be removed by a wet etching process or any other suitable process (370). Subsequent selective or non-selective deposition processes may then be optionally performed on the die (380).

Figure 4:
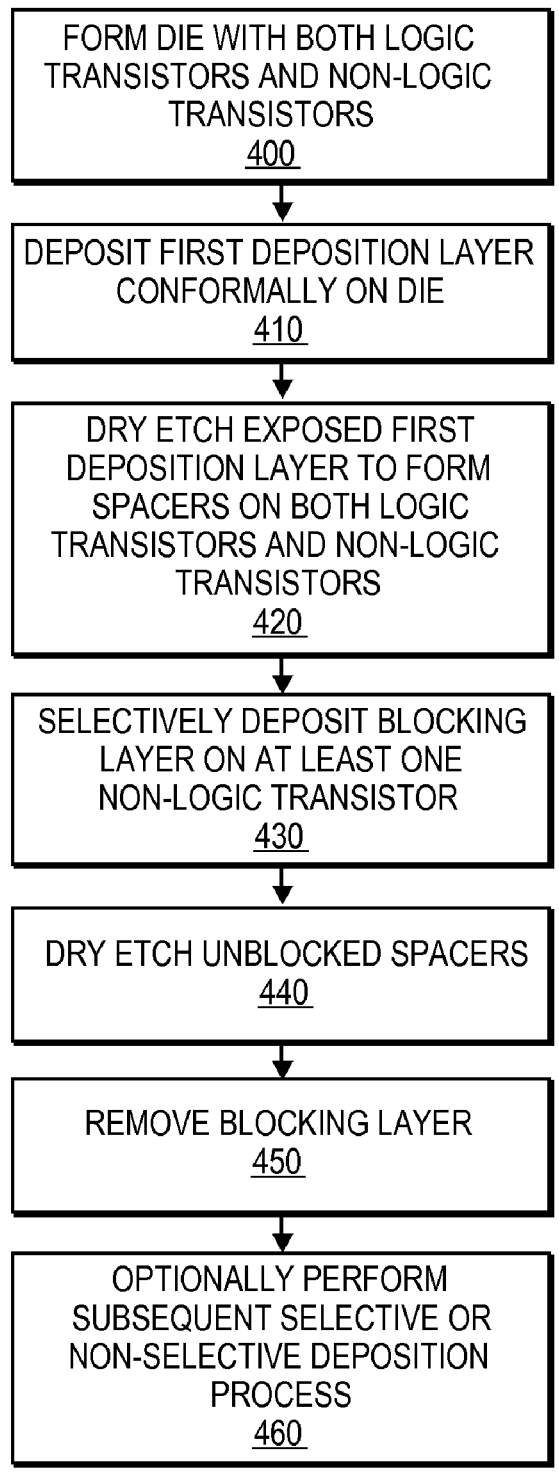
FIG. 4 illustrates a schematic of an alternative embodiment of one method of selectively depositing a spacer on a microelectronic device.

FIG. 4 represents an alternative schematic of an embodiment of a selective spacer deposition process. A die can be formed with both Logic transistors and non-Logic transistors (400). In some embodiments, the non-Logic transistors can be Memory (SRAM) and Logic transistors. In some embodiments, Logic transistors are situated randomly and Memory transistors are arranged in an array. A first deposition layer can be conformally deposited on the die (410). A dry etch process can be performed on the first deposition layer leaving spacers on both Logic transistors and non-Logic transistors (420). Then, a blocking layer can be selectively deposited on at least one non-Logic transistor (430). A dry etch process can be performed on any unblocked spacer (440). In this manner, the size of any exposed unblocked spacer can be selectively partially or completely removed. Subsequently, the blocking layer can be removed by ashing or any other suitable method (450). Subsequent selective or non-selective deposition processes may then be optionally performed on the die (460).

According to embodiments of the above-described methods, a thicker spacer can be formed on gate structures of Logic transistors than on co-situated gate structures of non-Logic transistors. "Co-situated" means both Logic transistors and non-Logic transistors are situated on the same die. The result can be to decrease OFF state leakage in Logic transistors without closing the spacer-to-spacer gap between gate structures in stacked devices while simultaneously keeping a thinner spacer on SRAM transistors to prevent closing the spacer-to-spacer gap between gate structures in these types of arrays.

Doping of the source and drain regions with respect to each class of transistors can be accomplished without blocking thereof.

It should be appreciated that the embodiments described above can apply to any combination of classes of devices depending on a designer's needs and the power/performance trade-off. That is, a first spacer of a first size can be formed on a first class of devices and a second spacer of a second size can be formed on a second class of devices wherein the classes can be different. Examples include, but are not limited to, a first class including NMOS devices and a second class including PMOS devices (or vice-versa) inside a Logic circuit; a first class including NMOS devices and a second class including PMOS devices (or vice-versa) inside a SRAM memory array circuit; a first class including both NMOS and PMOS devices inside an SRAM memory array circuit and a second class including both NMOS and PMOS devices inside a Logic circuit; or a first class including all PMOS devices inside SRAM and Logic circuits and a second class including all NMOS devices inside SRAM and Logic circuits. The combinations are virtually limitless.

Figure 5:
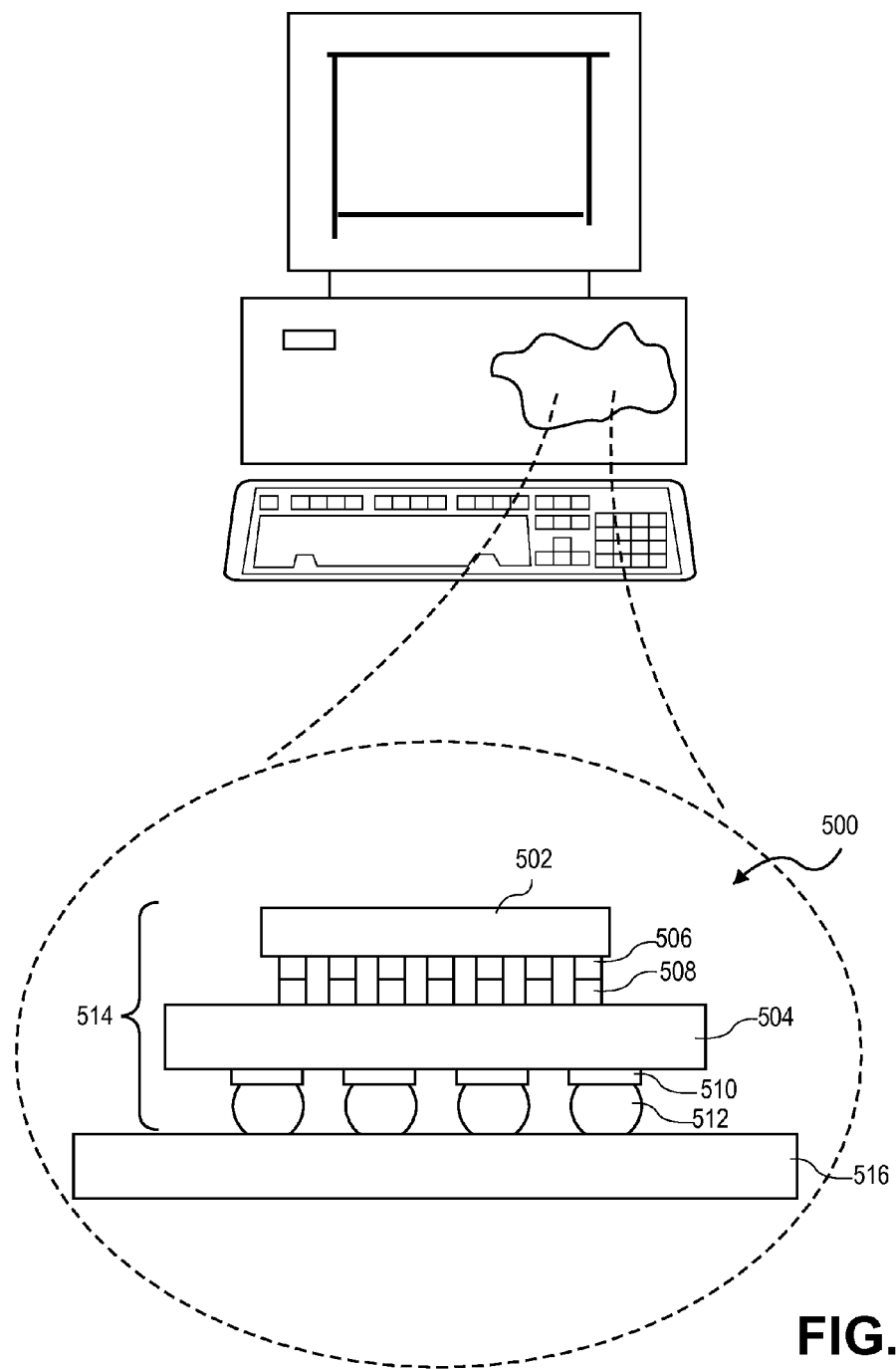
FIG. 5 shows a computer system including microprocessor enclosed by a package mounted to a printed circuit board.

FIG. 5 shows a cross-sectional side view of an integrated circuit package that is physically and electrically connected to a printed wiring board or printed circuit board (PCB) to form an electronic assembly. The electronic assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tapes and compact disc player, video cassette recorder, motion picture expert group audio layer 3 player (MP3), etc.), and the like. FIG. 5 illustrates the electronic assembly as part of a desktop computer. FIG. 5 shows electronic assembly 500 including die 502, physically and electrically connected to package substrate 504. Die 502 is an integrated circuit die, such as a microprocessor die, having, for example, transistor structures interconnected or connected to power/ground or input/output signals external to the die through interconnect lines to contacts 506 on an external surface of die 502. The die may be formed in accordance with known wafer processing techniques using as the substrate described with reference to FIGS. 2A-2H. Contacts 506 of die 502 may be aligned with contacts 508 making up, for example, a die bump layer on an external surface of package substrate 504. On a surface of package substrate 504 opposite a surface including contacts 508 are land contacts 510. Connected to each of land contacts 510 are solder bumps 512 that may be used to connect package 514 to circuit board 516, such as a motherboard or other circuit board.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that the fabrication of a multiple metal layer structure atop a substrate, such as a silicon substrate, to manufacture silicon device is well known in the art. Therefore, it is appreciated that the figures provided herein illustrate only portions of an exemplary microelectronic device that pertains to the practice of the present invention. Thus the present invention is not limited to the structures described herein.

What is claimed is:

1. A system comprising:
a computing device comprising:
a microprocessor;
a printed circuit board; and
a substrate, wherein the microprocessor is coupled to the printed circuit board through the substrate, the microprocessor comprising a die, a first class of transistors comprising logic transistors on the die, a second class of transistors comprising memory transistors on the die, a first spacer adjacent to a gate structure of the first class of transistors, and a second spacer adjacent to a gate structure of the second class of transistors, the second spacer having a thickness less than the spacer on the first class of transistors;
wherein the first class of transistors comprising NMOS devices are inside a logic circuit and the second class of transistors are inside an SRAM circuit.

* * * * *